United States Patent
Kumar et al.

(10) Patent No.: US 6,489,231 B1
(45) Date of Patent: Dec. 3, 2002

(54) METHOD FOR FORMING BARRIER AND SEED LAYER

(75) Inventors: Kiran Kumar, Sunnyvale, CA (US); Zhihai Wang, Sunnyvale, CA (US); Wilbur G. Gatabay, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/907,424

(22) Filed: Jul. 17, 2001

(51) Int. Cl.[7] .......................... H01L 21/4763
(52) U.S. Cl. ............... 438/627; 438/628; 438/618; 438/622; 438/625; 438/629; 438/687; 257/751; 257/753
(58) Field of Search .............. 438/687, 627, 438/628, 629, 625, 622, 618; 257/751, 753

(56) References Cited

U.S. PATENT DOCUMENTS

| | | | |
|---|---|---|---|
| 6,410,985 B1 | * | 1/2002 | Chan et al. |
| 6,350,364 B1 | * | 2/2002 | Jang |
| 6,372,622 B1 | * | 4/2002 | Tan et al. |
| 6,398,855 B1 | * | 6/2002 | Palmans et al. |
| 6,413,383 B1 | * | 7/2002 | Chiang et al. |
| 6,426,293 B1 | * | 7/2002 | Wang et al. |
| 2002/0041028 A1 | * | 4/2002 | Choi et al. |
| 2002/0093075 A1 | * | 7/2002 | Marathe et al. |

FOREIGN PATENT DOCUMENTS

EP  001069612 A2  *  1/2001

* cited by examiner

Primary Examiner—Long Pham
(74) Attorney, Agent, or Firm—Luedeka, Neely & Graham

(57) ABSTRACT

A method for creating a highly reflective surface on an electroplated conduction layer. A barrier layer is deposited on a substrate using a self ionized plasma deposition process. The barrier layer has a thickness of no more than about one hundred angstroms. An adhesion layer is deposited on the barrier layer, using a self ionized plasma deposition process. A seed layer is deposited on the adhesion layer, also using a self ionized plasma deposition process, at a bias of no less than about one hundred and fifty watts. The combination of the barrier layer, adhesion layer, and seed layer is at times referred to herein as the barrier seed layer. The conduction layer is electroplated on the seed layer, thereby forming the highly reflective surface on the conduction layer, where the highly reflective surface has a reflectance of greater than about seventy percent.

18 Claims, 2 Drawing Sheets

METHOD FOR FORMING BARRIER AND SEED LAYER

FIELD

The invention relates generally to the field of integrated circuit fabrication and, in particular, to improved metallization methods useful in the production of semiconductor devices.

BACKGROUND

During the manufacture of integrated circuits, such as semiconducting devices, various conductive and insulative layers of material are deposited on a substrate to provide circuits and interconnects between the circuits. As integrated circuits continue to shrink in size and become more powerful, newer and better manufacturing techniques are devised to improve their performance.

It is desirable for the metallization process to provide surfaces that have high reflectivity. Reflectivity is an indication of the surface roughness, or smoothness, as determined by the amount of light reflected from the surface. Surfaces with a low reflectivity are typically rougher than surfaces of the same material that have a high reflectivity. The reflectivity is expressed in terms of a percentage, based on the intensity of the reflected light compared to the intensity of the incident light. A highly reflective surface tends to be easier to planarize using a process such as chemical mechanical polishing.

Metal layers that are electroplated on sputtered barrier and seed layer systems typically exhibit a high degree of surface roughness. This is especially true for copper layers that are electroplated on top of a tantalum nitride, tantalum barrier layer and copper seed layer that are deposited using a self ionized plasma sputter process. High surface roughness of the electroplated copper layers manifests itself as a relatively low reflectance, which condition is also called haze, which in other words is a reflectance that is below about seventy percent.

Self ionized plasma deposited barrier seed layer also typically exhibit a high degree of instability. As the layer self anneals, the mean sheet resistance and sheet resistance uniformity tend to change for several hours or so after deposition. The reflectivity problems and resistivity problems, described above, adversely affect later processes such as the chemical mechanical polishing step, and tends to impact line resistance and electromigration properties of the layer.

There exists a need, therefore, for improved methods of manufacture to enhance the uniformity of the underlying layers and increase the reflectance of the plated layers, while at the same time maintaining adequate barrier layers between the electroplated layer and the substrate.

SUMMARY

The above and other needs are met by a method for creating a highly reflective surface on an electroplated conduction layer. A barrier layer is deposited on a substrate using a self ionized plasma deposition process. The barrier layer has a thickness of no more than about one hundred angstroms. An adhesion layer is deposited on the barrier layer, using a self ionized plasma deposition process. A seed layer is deposited on the adhesion layer, also using a self ionized plasma deposition process, at a bias of no less than about one hundred and fifty watts. The combination of the barrier layer, adhesion layer, and seed layer is at times referred to herein as the barrier seed layer. The conduction layer is electroplated on the seed layer, thereby forming the highly reflective surface on the conduction layer, where the highly reflective surface has a reflectance of greater than about seventy percent.

In another aspect the invention provides a method for creating a highly reflective surface on a metal layer system having a substantially constant mean sheet resistance. A barrier layer is deposited on a substrate using a self ionized plasma deposition process. The barrier layer has a thickness of no more than about one hundred angstroms. An adhesion layer is deposited on the barrier layer, using a self ionized plasma deposition process. A seed layer is deposited on the adhesion layer, also using a self ionized plasma deposition process, at a bias of no less than about one hundred and fifty watts. A conduction layer is electroplated on the seed layer, thereby forming the highly reflective surface on the conduction layer, where the highly reflective surface has a reflectance of greater than about seventy percent.

An advantage of the invention is that the electroplated conduction layer deposited on the barrier seed layer formed as described above exhibits a significantly higher reflectance, or in other words much lower surface roughness, than an electroplated conduction layer deposited on a barrier seed layer formed by prior art processes. Furthermore, the self ionized plasma deposited barrier seed layer as described above tends to be more uniform and stable over time with respect to the mean sheet resistance of the layer, which may indicate a lower degree of self annealing. Because the mean sheet resistance of the barrier seed layer is relatively constant over time, the amount of elapsed time between the barrier seed layer deposition and the electroplating step is less critical, and may be substantially shorter. The process is also tends to reduce electromigration within the electroplated conduction layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

FIGS. 1–5 depict a method for applying various layers to a substrate 12, such as a semiconducting substrate for the formation of an integrated circuit 10. The invention is particularly applicable to metal interconnects provided in vias, such as in a copper dual damascene structure. However, the invention is equally applicable to electroplating of other metal structures on other substrates. As used herein, a reference to a metal also includes various alloys of the metal.

In a preferred embodiment, a method according to the invention is directed to applying a barrier seed layer to a substrate 12 of an integrated circuit 10, so that the electroplated metal deposited on the barrier seed layer exhibits high reflectance and reduced electromigration. While the layers according to the invention may be applied directly to a silicon substrate, it is preferable to apply such layers to insulating or dielectric layers already on the silicon substrate. Suitable dielectric or insulating layers may include silicon oxide, such as silicon dioxide, silicon nitride, glass, and other such materials. For clarity and simplicity in the explanation, only the layers applied according to the present invention are shown and discussed in detail herein.

To apply a barrier seed layer to a substrate 12, the substrate 12 is preferably inserted in a deposition chamber. In the case of electroplated copper, the barrier seed layer is preferably a barrier layer of tantalum nitride, an adhesion layer of tantalum, and a seed layer of copper, most preferably deposited in that order. The deposition process employed is most preferably a self ionized plasma physical vapor deposition process. The three deposition processes may be conducted in separate deposition chambers, such as in a cluster tool, or may alternately be conducted in a single deposition chamber.

Figure 1:
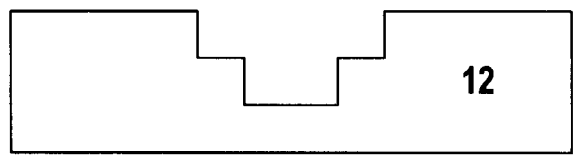
FIGS. 1–5 are cross sectional views of a substrate illustrating the steps for depositing the layers according to the present invention.
Figure 2:
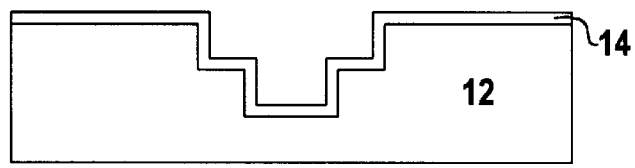
Figure 3:
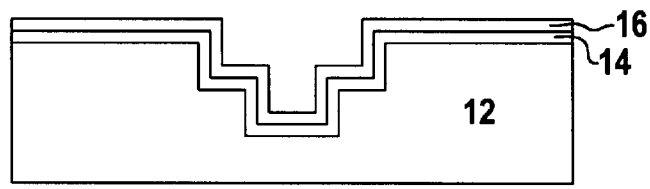

A barrier layer 14 is applied to the substrate 12, as depicted in FIG. 2. The barrier layer 14 is preferably tantalum nitride. The barrier layer 14 is preferably applied with a thickness of no more than about one hundred angstroms. The relatively thin barrier layer 14 tends to result in an increase in smoothness and reflectance of the electroplated conduction layer, as described in more detail below. The barrier layer 14 is preferably applied in a self ionized plasma with an alternating current bias of no less than about three hundred watts. Other parameters for the deposition are set as for standard processing.

An adhesion layer 16 is preferably applied to the barrier layer 14, as depicted in FIG. 2. The adhesion layer 16 is preferably tantalum. As with the barrier layer 14, the adhesion layer 16 of tantalum is preferably applied in an self ionized plasma deposition using an alternating current bias of no less than about three hundred watts. As before, other parameters for the deposition are set as for standard processing.

By selecting a barrier layer 14 thickness of no more than about one hundred angstroms, the adhesion layer 16 thickness is selected within relatively wide limits, provided the overall properties of the barrier layer 14 and the adhesion layer 16 are sufficient to inhibit migration of metal ions, such as from the subsequent layers, into the substrate 12.

Figure 4:
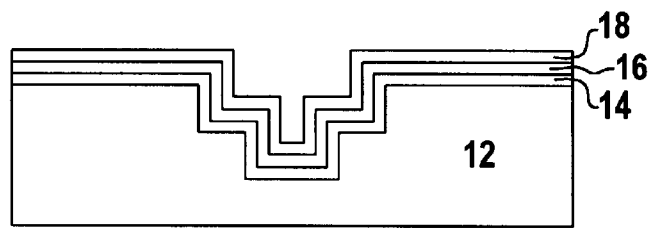

With reference to FIG. 4, a seed layer 18, preferably containing metal ions similar to or compatible with the metal to be applied using the subsequent electroplating process, is then deposited on the adhesion layer 16. The seed layer 18 is preferably copper. Preferably, the seed layer 18 is deposited with a thickness of from about one thousand angstroms to about two thousand angstroms, and most preferably about twelve hundred and fifty angstroms. As with the barrier layer 14 and adhesion layer 16, the seed layer 18 is preferably applied in a self ionized plasma deposition with an alternating current bias of no less than about one hundred and fifty watts, and most preferably no less than about three hundred watts. As before, other parameters for the deposition are set as for standard processing.

Figure 5:
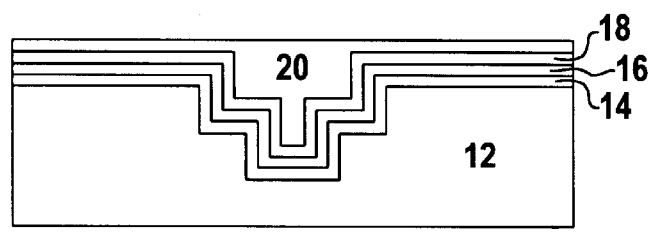

As depicted in FIG. 5, a conduction layer 20 is preferably deposited on top of the seed layer 18. The conduction layer 20 is preferably deposited in an electroplating process. Most preferably, the conduction layer 20 is formed of the same material as the seed layer 18, which is most preferably copper. The conduction layer 20 is preferably formed according to standard processing. However, because of the novel deposition process parameters used for the deposition of the barrier seed layer as described above, the conduction layer 20 tends to have a reflectance that is dramatically enhanced over that produced by prior art processes. Further, the conduction layer 20 also tends to be more resistant to electromigration.

An advantage of the invention when using self ionized plasma deposition processes as described above to apply the barrier seed layer to the substrate 12 is that the barrier seed layer tends to exhibit a significantly more stable mean sheet resistance and resistance uniformity over time. Accordingly, it is believed that self annealing of the self ionized plasma deposited barrier seed layer is less than with prior art processing. A comparison of the resistance properties of the barrier seed layer and the electroplated copper conductance layer 20 reflectance properties for various barrier adhesion layer thicknesses and seed layer 18 bias powers are given in Table 1.

TABLE 1

| | Barrier Layer Thickness (angstroms) | Adhesion Layer Thickness (angstroms) | Seed Layer Bias (watts) | Seed Layer RSM | Seed Layer RSM SD % | Conduction Layer Mean Reflectance (%) | Conduction Layer Mean Reflectance Std Dev. % |
|---|---|---|---|---|---|---|---|
| 1 | 100 | 100 | 50 | 0.15 | 10.58 | 26.7 | 49.8 |
| 2 | 100 | 100 | 300 | 0.20 | 3.63 | 73.6 | 15.1 |
| 3 | 100 | 150 | 50 | 0.15 | 9.86 | 26.7 | 47.4 |
| 4 | 100 | 150 | 300 | 0.2 | 3.44 | 69.9 | 15.1 |
| 5 | 150 | 100 | 50 | 0.14 | 5.11 | 15.6 | 38.8 |
| 6 | 150 | 100 | 300 | 0.19 | 7.51 | 42.3 | 49.4 |
| 7 | 150 | 150 | 50 | 0.14 | 5.78 | 15.4 | 42.9 |
| 8 | 150 | 150 | 300 | 0.2 | 5.8 | 47.7 | 41.5 |
| 9 | 83 | 125 | 175 | 0.19 | 3.13 | 79.1 | 1.6 |
| 10 | 167 | 125 | 175 | 0.16 | 11.34 | 26.1 | 66.4 |
| 11 | 125 | 83 | 175 | 0.17 | 8.66 | 39.3 | 38.6 |
| 12 | 125 | 167 | 175 | 0.17 | 10.43 | 28.7 | 55.6 |
| 13 | 125 | 125 | 0 | 0.13 | 5.11 | 16.9 | 26.4 |
| 14 | 125 | 125 | 385 | 0.21 | 3.8 | 71.8 | 15.3 |
| 15 | 125 | 125 | 175 | 0.17 | 10.21 | 31.9 | 46.6 |
| 16 | 125 | 125 | 175 | 0.17 | 8.99 | 31.5 | 50.6 |

TABLE 1-continued

| Barrier Layer Thickness (angstroms) | Adhesion Layer Thickness (angstroms) | Seed Layer Bias (watts) | Seed Layer RSM | Seed Layer RSM SD % | Conduction Layer Mean Reflectance (%) | Conduction Layer Mean Reflectance Std Dev. % |
|---|---|---|---|---|---|---|
| 17 | 125 | 125 | 175 | 0.17 | 8.7 | 34.3 | 43.7 |
| 18 | 125 | 125 | 175 | 0.17 | 8.54 | 34.4 | 46.9 |
| 19 | 125 | 125 | 175 | 0.17 | 9.17 | 34.8 | 40.3 |
| 20 | 125 | 125 | 175 | 0.17 | 8.69 | 32.5 | 46.9 |

As shown in Table 1, the lowest standard deviation percentage (SD%) for the an sheet resistance (RSM) and conduction layer 20 reflectance occurred with a tantalum nitride barrier layer 14 thickness of eighty-three angstroms, a tantalum adhesion layer 16 thickness of one hundred and twenty-five angstroms, and a copper seed layer 18 bias of one hundred and seventy-five watts. The standard deviation of the reflectance tends to be best when the reflectance percentage is the highest. There tends to be excellent correlation between the standard deviation of the reflectance of the electroplated copper conduction layer 20 and the standard deviation of the mean sheet resistance of the barrier seed layer. This correlation tends to provide support for the theory that the uniformity of the grain size of the copper seed layer 18 is determinative of the mean sheet resistance uniformity and electroplated copper conduction layer 20 reflectance properties.

Increasing the tantalum nitride barrier layer 14 thickness to one hundred angstroms or above tended to require a higher copper seed layer 18 bias (samples 2, 4 and 14) in order to achieve relatively uniform mean sheet resistance and mean reflectance of the electroplated conduction layer 20. A mean reflectance of greater than about seventy percent was not observed at a copper seed layer 18 bias of less than one hundred and fifty watts, as shown by samples 1, 3, 5 and 7, regardless of the thickness of the barrier layer 14 and the adhesion layer 16.

All of the samples in Table 1 tend to indicate that the adhesion layer 16 thickness has little or no impact on the reflectance of the conduction layer 20, especially at a higher copper seed layer 18 bias. As seen by samples 2, 4 and 14, only with a copper seed layer 18 bias of greater than about two hundred watts was a uniformity of the electroplated copper conduction layer 20 reflectance of about fifteen percent or less observed. The above samples also show that the mean sheet resistance of the seed layer 18 tends to increase with the copper seed layer 18 bias, which may be a result of the resputtering effect that leads to layer thinning.

Figure 6:
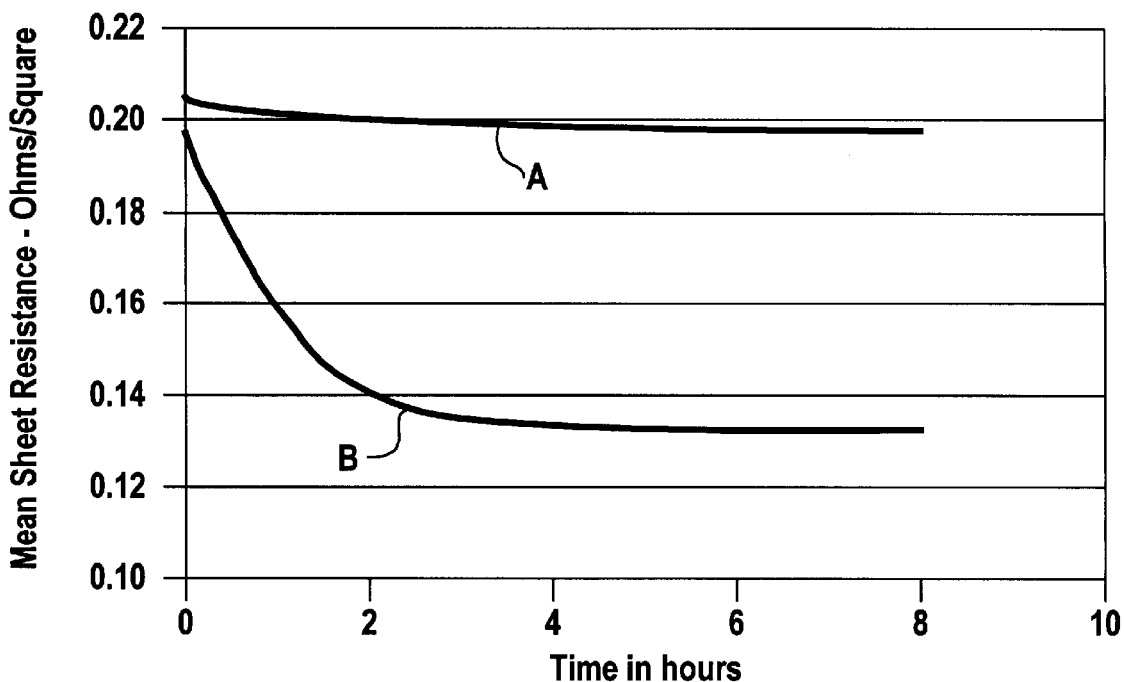
FIG. 6 is a graphical comparison of the change in mean sheet resistance over time for substrates containing layers made according to the present invention and prior art methods.
Figure 7:
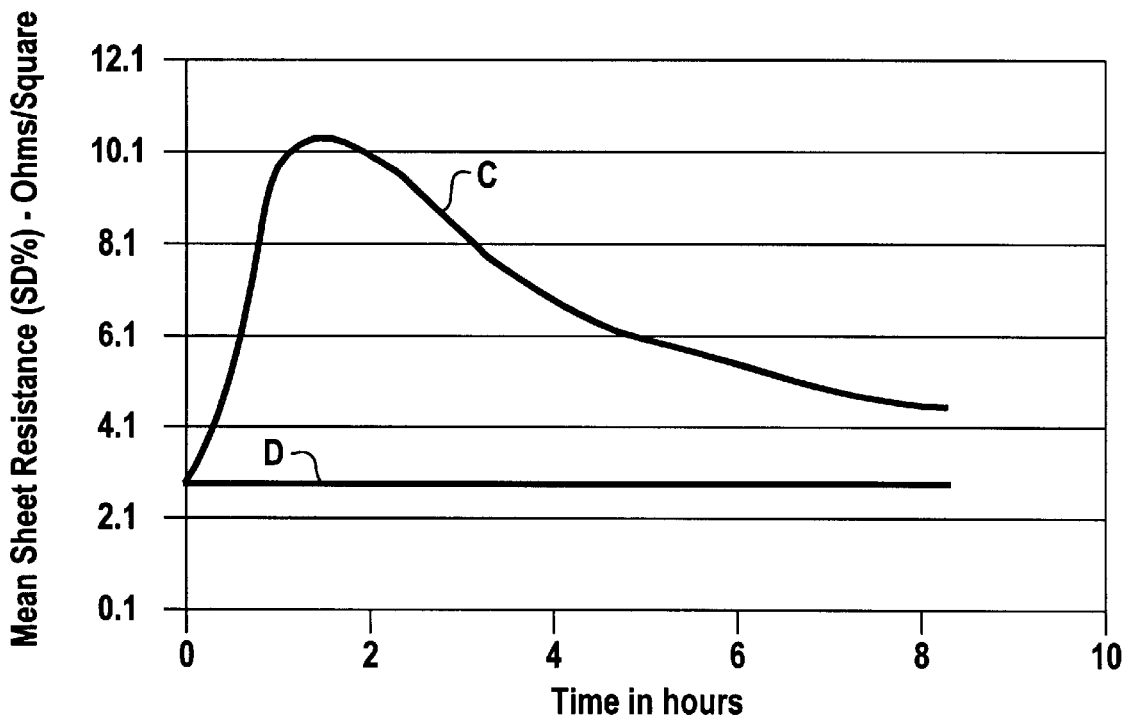
FIG. 7 is a graphical comparison of the change in mean sheet resistance standard deviation percentage over time for substrates containing layers made according to the present invention and prior art methods.

A comparison of the mean sheet resistance of the barrier seed layer made according to the present invention and by prior art processes is shown graphically in FIGS. 6 and 7. The data for the mean sheet resistance aging and standard deviation were obtained from a barrier seed layer made as follows:

Curve A of FIG. 6 and curve D of FIG. 7 were generated from aging data for ninety angstroms of a tantalum nitride barrier layer 14, one hundred and sixty angstroms of a tantalum adhesion layer 16, and fifteen hundred angstroms of a copper seed layer 18, each deposited by self ionized plasma deposition at three hundred watts alternating current bias. Curve B of FIG. 6 and curve C of FIG. 7 were generated from aging data for one hundred and fifty angstroms of a tantalum nitride barrier layer 14, and one hundred angstroms of a tantalum adhesion layer 16, each deposited by self ionized plasma deposition at three hundred watts alternating current bias, and fifteen hundred angstroms of a copper seed layer 18 deposited by self ionized plasma deposition at fifty watts alternating current bias.

As shown by FIGS. 6 and 7, the mean sheet resistance and standard deviation percentage of the barrier seed layer of the present invention (curves A and D) are relatively constant over time, whereas the mean sheet resistance and standard deviation percentage of the barrier seed layer made by a conventional process vary significantly over time. It is indicated, based on the data given in Table 1, that the reflectance of a metal conductive layer 20 applied by an electroplating process to the barrier seed layer made according to the present invention exhibits substantially higher reflectance, typically above about seventy percent, and that subsequent chemical mechanical polishing of the conductive layer 20 proceeds in a substantially uniform manner from substrate to substrate. As a result of the observed stability of the barrier seed layer provided according to the present invention, the time before which the conduction layer 20 is deposited on the barrier seed layer is less critical, providing increased manufacturing freedom.

Most preferably, the barrier seed layer is formed by a self ionized plasma deposition with an alternating current bias of no less than about three hundred watts, where the tantalum nitride barrier layer 14 is deposited to about ninety angstroms, the tantalum adhesion layer 16 is deposited to about one hundred and sixty angstroms, and the copper seed layer 18 is deposited to about twelve hundred and fifty angstroms.

It is appreciated that there are many steps that are required to accomplish the processing as described above, and that some intermediate steps, such as patterning, etching and stripping steps, have been omitted. However, those steps which are not completely described above are preferably accomplished according to the processes that are known to be compatible with the materials and processes as described above. Those steps which are not described herein have been omitted so as to not unnecessarily encumber this description of the more relevant portions of the invention.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for creating a highly reflective surface on an electroplated conduction layer, the method comprising the steps of:

depositing a barrier layer on a substrate using a self ionized plasma deposition process, the barrier layer having a thickness of no more than about one hundred angstroms, depositing an adhesion layer on the barrier layer using a self ionized plasma deposition process, depositing a seed layer on the adhesion layer using a self ionized plasma deposition process at a bias of no less than about one hundred and fifty watts, and electroplating the conduction layer on the seed layer, thereby forming the highly reflective surface on the conduction layer, where the highly reflective surface has a reflectance of greater than about seventy percent.

2. The method of claim 1 wherein the barrier layer comprises tantalum nitride.

3. The method of claim 1 wherein the adhesion layer comprises tantalum.

4. The method of claim 1 wherein the seed layer comprises copper.

5. The method of claim 1 wherein the conduction layer comprises copper.

6. The method of claim 1 wherein the barrier layer, adhesion layer, and seed layer system exhibits a substantially constant mean sheet resistance over time.

7. The method of claim 1 wherein the barrier layer is deposited with an alternating current bias of no less than about three hundred watts.

8. The method of claim 1 wherein the adhesion layer is deposited with an alternating current bias of no less than about three hundred watts.

9. The method of claim 1 wherein the seed layer is deposited with an alternating current bias of no less than about three hundred watts.

10. The method of claim 1 wherein the barrier layer and the adhesion layer are deposited to a total thickness that is sufficient to ensure an adequate barrier between the conduction layer and the substrate.

11. A method for creating a highly reflective surface on a metal layer system having a substantially constant mean sheet resistance, the method comprising the steps of:

depositing a barrier layer on a substrate using a self ionized plasma deposition process, the barrier layer having a thickness of no more than about one hundred angstroms, depositing an adhesion layer on the barrier layer using a self ionized plasma deposition process, depositing a seed layer on the adhesion layer using a self ionized plasma deposition process at a bias of no less than about one hundred and fifty watts, and electroplating a conduction layer on the seed layer, thereby forming the highly reflective surface on the conduction layer, where the highly reflective surface has a reflectance of greater than about seventy percent.

12. The method of claim 11 the barrier layer comprises tantalum nitride.

13. The method of claim 11 wherein the adhesion layer comprises tantalum.

14. The method of claim 11 wherein the seed layer comprises copper.

15. The method of claim 11 wherein the conduction layer comprises copper.

16. The method of claim 11 wherein the barrier layer is deposited with an alternating current bias of no less than about three hundred watts.

17. The method of claim 11 wherein the adhesion layer is deposited with an alternating current bias of no less than about three hundred watts.

18. The method of claim 11 wherein the seed layer is deposited with an alternating current bias of no less than about three hundred watts.

* * * * *